(12) United States Patent
Lo et al.

(10) Patent No.: US 6,507,098 B1
(45) Date of Patent: Jan. 14, 2003

(54) MULTI-CHIP PACKAGING STRUCTURE

(75) Inventors: Randy H. Y. Lo, Taichung Hsien (TW); Chi-Chuan Wu, Taichung (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 09/417,409

(22) Filed: Oct. 13, 1999

(51) Int. Cl.[7] .................. H01L 23/02; H01L 23/10; H01L 23/34; H01L 23/48; H01L 23/52
(52) U.S. Cl. ............. 257/686; 257/707; 257/723; 257/724; 257/777
(58) Field of Search .................. 257/686, 707, 257/723, 724, 777, 779, 780, 784; 438/106, 107, 110, 127

(56) References Cited

U.S. PATENT DOCUMENTS 5,903,052 A * 5/1999 Chen et al. ............. 257/706
6,104,089 A * 8/2000 Akram ................... 257/723
6,184,580 B1 * 2/2001 Lin ........................ 257/712

* cited by examiner

Primary Examiner—Jerome Jackson
Assistant Examiner—Shrinivas H. Rao
(74) Attorney, Agent, or Firm—J.C. Patents

(57) ABSTRACT

A multi-chip packaging structure in which a plurality of chips is aligned on two surfaces of a substrate and the substrate has an opening. The chip located on the second surface of the substrate has center bonding pads arrangement. These bonding pads are connected to the conductive connections on the first surface of the substrate by means of the opening. The other chips are attached to the first surface of the substrate and have a plurality of bonding pads connected to the conductive connections on the first surface of the substrate by wire bonding or flip-chip bonding. Furthermore, a heat sink is attached to the back surface of the chip located on the second surface in order to improve the heat dissipation performance of the package.

11 Claims, 2 Drawing Sheets

MULTI-CHIP PACKAGING STRUCTURE

BACKGROUND OF THE INVENTION

1. Field of the Invention

The present invention relates to a multi-chip packaging structure. More particularly, the present invention relates to a multi-chip packaging structure with enhanced integration level and heat dissipation performance.

2. Description of the Related Art

High performance, high integration level, low cost, and increased miniaturization of components for electronic products have long been the goals of manufacturing design. For semiconductor fabrication, mass production of 0.18 microns structure has already begun and its integration level need not be emphasized. However, the integration level of packaging is mainly determined in terms of the densification of the carriers and the spaces used for connections between the chips and the carriers.

Lead-over-chip (LOC) arrangement is a typical packaging structure employed to reduce the spaces used for connections between the chips and the carriers. Generally speaking, such arrangement includes a lead frame with a plurality of lead fingers extended to the center bonding pads of the chip and attached to the active surface of the chip. Moreover, the lead fingers also provide physical support for the chip. Thus, this arrangement can reduce the overall volume of the package. Therein, the carriers used include typical LOC lead frames, or laminated substrates with openings or slots.

In addition, a multichip module (MCM) arrangement is also a typical high integration level packaging structure. The MCM constitutes the encapsulation of a plurality of semiconductor chips on a single carrier which is usually called a laminated substrate. These chips include microprocessors, DRAMs, SRAMs, Flash memories and so on. Encapsulation of them not only reduces the volume of the package but also increases the performance by shortening the connection paths among chips.

Currently, a MCM is usually affixed to a printed circuit board (PCB) with a plurality of chips positioned on the same surface of the PCB. Connections to the PCB include wire bonding, tape automatic bonding (TAB), or flip-chip bonding. However, as known in the art, a MCM mainly aligns the chips to the same surface of the PCB. This arrangement occupies a relatively large area. Furthermore, the connection paths among chips are by means of complicated routes inside the PCB. Thus, the length and the resistance of the paths are both increased. Hence, the overall performance of the package is reduced.

In addition, as a plurality of chips is operated in a relatively small area in a multi-chip package, a considerably large amount of heat is generated. How to effectively dissipate the generated heat, which affects the performance of a multi-chip package, is currently of great concern to industry.

SUMMARY OF THE INVENTION

Accordingly, one object of the present invention is to provide a multi-chip packaging structure in which the signal paths between chips can be reduced, and hence, the overall performance can then be increased.

Another object of the present invention is to provide a multi-chip packaging structure in which the overall volume of the package can be reduced, and hence, the integration level of the package can then be increased.

Yet another object of the present invention is to provide a multi-chip packaging structure in which the heat dissipation performance of the package can be improved.

Still another object of the present invention is to provide a multi-chip ball grid array packaging structure in which the volume of the package can be reduced, the package integration level is increased, and the connection paths among chips is shortened so that the overall performance is increased. Also, the heat dissipation performance of the package can be improved.

These objects of the present invention have been achieved by introducing a multi-chip ball grid array packaging structure. The structure at least comprises a substrate, a first chip, a second chip, and a heat sink. The substrate has a first surface and a second surface, and an opening passing through the first surface and the second surface. It also includes a plurality of conductive areas located on the first surface, with at least one of the conductive areas lying laterally adjacent to the perimeter of the opening. The first chip includes a first active surface and a first back surface, with a plurality of first bonding pads located on the first active surface. The first chip is arranged with the first active surface facing the second surface and secured on it such that the first bonding pads are exposed by the opening. The first bonding pads are electrically connected to the conductive areas lying laterally adjacent to the opening by bonding wires extending through the opening. The second chip includes a second active surface and a second back surface, with a plurality of second bonding pads located on the second active surface. The second chip is secured on the first surface of the substrate with the second bonding pads of the second chip electrically connected to the conductive areas of the substrate. A heat sink is located on the first back surface of the first chip and is thermally coupled with the first chip.

In a preferred embodiment according to the present invention, the structure described above can be positioned on laminated substrates for ball grid array assemblies. Then, a plurality of solder ball pads are also included on the second surface of the substrate with solder balls placed on them. The second chip is electrically connected to the conductive areas of the substrate by means of wire bonding or flip-chip bonding. When the center bonding pads arrangement is used in the first chip, the path of signal transmission between the first and the second chips can be reduced, and hence, the performance is increased. Also, the first chip and the second chips are separately located on the two surfaces of the substrate so that the area and the volume of the package can be reduced. A recess sized and shaped to receive the first chip can be defined on the second surface of the substrate; thus, the size of the package is further reduced. By means of the arrangement of the heat sink, the heat generated from the chips can be dissipated through the solder balls and the heat sink. Hence, the heat dissipation performance of the package is enhanced. Moreover, since the heat sink and the solder balls have been aligned on the same side, the heat sink can then be connected to the PCB by an adhesive. This allows the heat to be dissipated to the PCB, and hence, further improves the heat dissipation performance.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
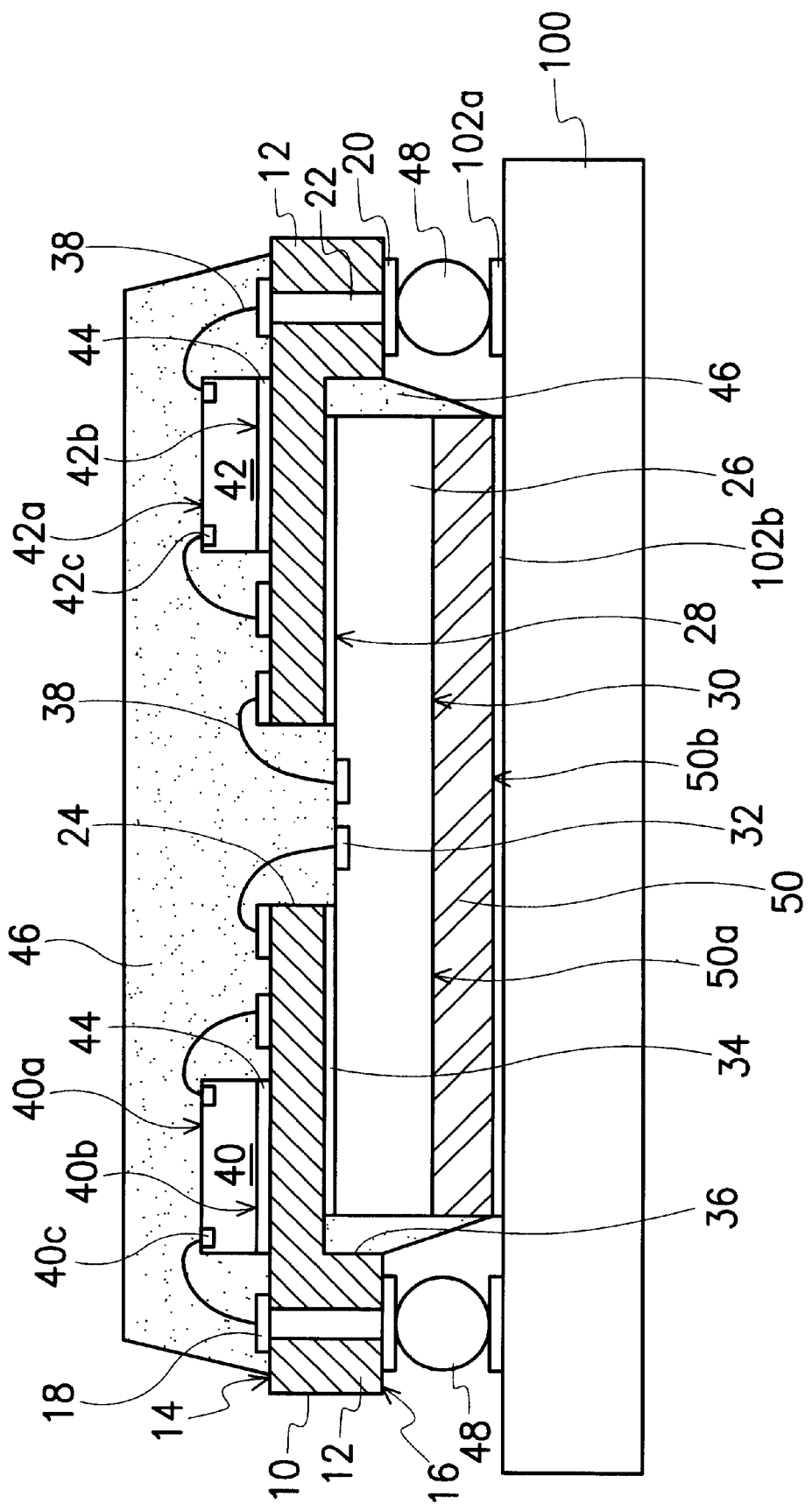
FIG. 1 is a schematic, cross-sectional view of a preferred embodiment of a multi-chip package in accordance with the present invention.

Reference is made to FIG. 1, which shows a schematic cross-sectional view of a preferred embodiment of a multi-chip package in accordance with the present invention. The multi-chip package in accordance with the present invention is arranged on a substrate 10. The substrate 10 is a typical laminated substrate having an insulated core layer 12 of materials such as FR-4, FR-5, or Bismaleimide-Triazine (BT). Moreover, a first surface 14 and a second surface 16 of the substrate 10 constitute conductive traces 18 and solder ball pads 20. They are fabricated by photolithographic and etching techniques on a copper film on the surface of the insulated core layer 12. The traces 18 are employed for signal transmission among chips. They include a plurality of conductive areas functioning as conductive connections to which the chips are connected. Also, solder balls 48 are placed on the solder ball pads 20. Although a two-layer substrate 10 is illustrated in FIG. 1, it is not intended to limit the number of layers used. Indeed, the substrate 10 can be a four-layer, six-layer, eight-layer, etc. structure according to design requirements. Connections between conductive layers (such as the traces 18) and the solder ball pads 20 are by means of through vias 22 in the insulated core layer 12. These vias 22 can be formed typically by a drilling and filling process. The periphery of via 22 has a plated metal layer of copper, as usual, and the inside is filled with filling material. There is an opening or a slot 24 passing through the substrate 10 and at least some of the traces 18 are located around the perimeter of the opening 24.

A first chip 26, with a first active surface 28 and a first back surface 30, is located on the second surface 16 of the substrate 10. The first active surface 28 is the portion on which semiconductor devices are fabricated and it constitutes a plurality of first bonding pads 32 located near the center of the chip. The first active surface 28 of the first chip 26 faces the second surface 16, and attachment to the second surface 16 is made by means of an adhesive 34 such that the first bonding pads 32 are exposed by the opening 24. Electrical connections between the first bonding pads 32 and the traces 18 of the first surface 14 are by means of bonding wires 38 made of materials including gold or aluminum. The bonding wires 38 pass through the opening 24 and are connected to the traces 18 near the perimeter of the opening 24. In accordance with the structure just mentioned, the substrate 10 is positioned on the first active surface 28 of the first chip 26. The first bonding pads 32, which are exposed by the opening 24, of the first chip 26 are electrically connected to the conductive traces 18 on the first surface 14 of the substrate 10 by bonding wires 38 passing through the opening 24. This arrangement forms a lead-over-chip (LOC) structure. To further reduce the size of the package, a recess 36, sized and shaped to receive the first chip 26, can be defined in the second surface 16 of the substrate 10. This greatly reduces the total thickness of the package.

Second chips 40, 42 are positioned on the first surface 14 of the substrate 10. Similarly, the second chips 40, 42 include second active surfaces 40a, 42a and second back surfaces 40b, 42b, respectively. There is also a plurality of second bonding pads 40c, 42c located on the second active surfaces 40a, 42a, respectively. The difference between the first chip 26 and the second chips 40, 42 is that the LOC structure is employed for the first chip 26, and hence, the first bonding pads 32 are arranged in central layout. However, the second bonding pads 40c, 42c of the second chips 40, 42 are in peripheral layout arrangement. Connections between the second chips 40, 42 and the substrate 10 are established by wire bonding in this embodiment. The second chips 40, 42 are secured on the first surface 14 by means of an adhesive 44, and the second bonding pads 40c, 42c are then electrically connected to the conductive traces 18 by bonding wires 38.

In order to enhance the heat dissipation performance of the package, a heat sink 50 is introduced in the first back surface 30 of the first chip 26. A surface 50a of the heat sink 50 is thermally coupled with the first chip 26. At least the first chip 26 and connections between the second chips 40, 42 and the substrate 10 are enveloped by an encapsulant 46 to provide environmental protection. The encapsulant includes resin, epoxy, liquid encapsulant, etc. A surface 50b of the heat sink 50 can be exposed to the outside during the encapsulating process in order to increase the heat dissipation performance. Solder balls 48 of, for example, tin-lead alloy are placed on the solder ball pads 20 for connections to the external circuitry and signal communication.

When the multi-chip package according to the present invention has been positioned on a printed circuit board 100, the solder balls 48 are attached to corresponding conductive areas 102a on the printed circuit board 100. The surface 50b of the heat sink 50 can be thermally coupled with the conductive areas 102a of the printed circuit board 100 in order to increase the heat dissipation performance. Furthermore, as the separation between the solder balls 48 and the conductive areas 102a of the printed circuit board 100 is limited, the deformation of the solder balls 48 during SMT processing or even the short circuit between adjacent solder balls is prevented. Hence, this increases the yield of the assembly.

Figure 2:
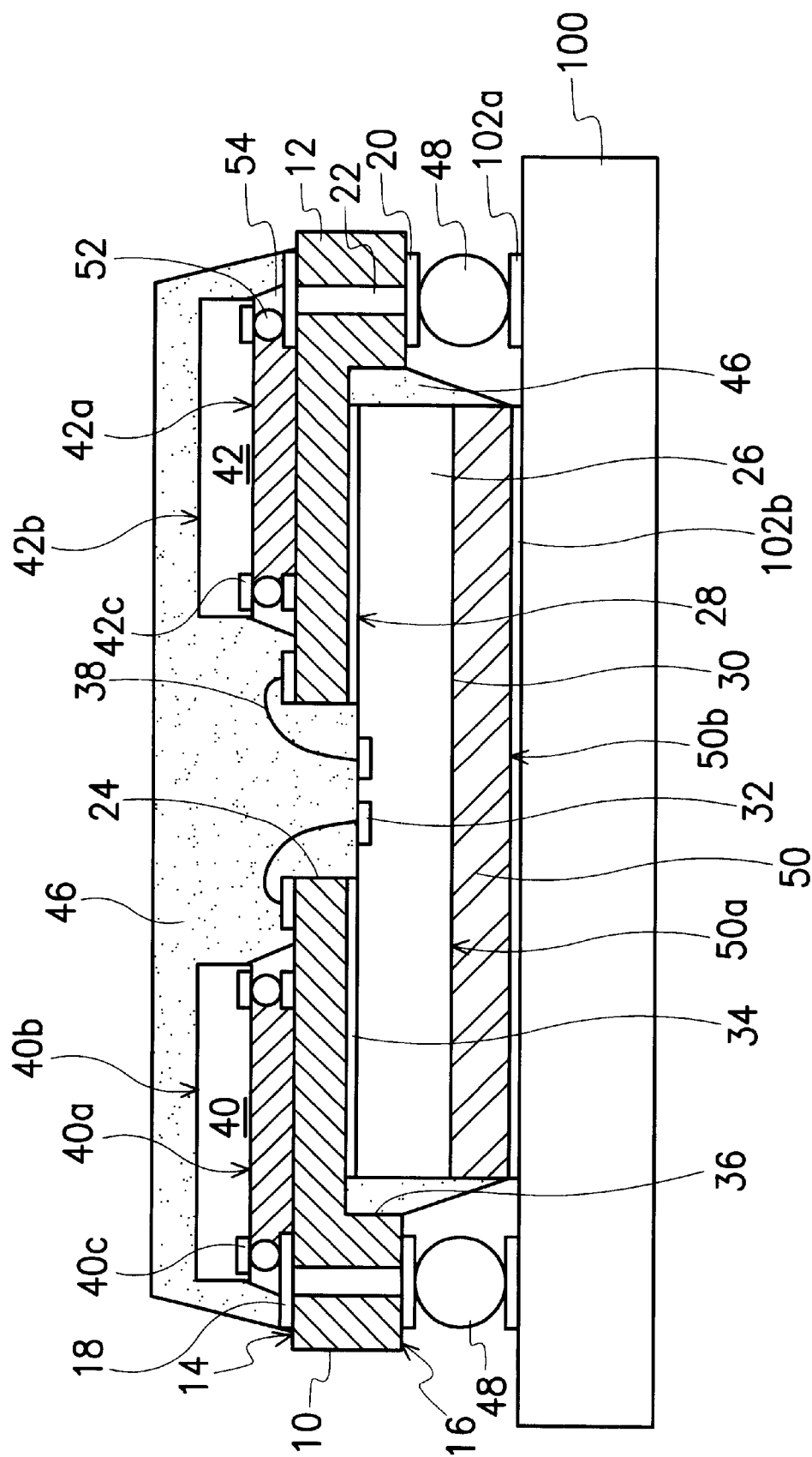
FIG. 2 is a schematic, cross-sectional view of another preferred embodiment of a multi-chip package in accordance with the present invention.

Reference is made to FIG. 2, which illustrates a schematic cross-sectional view of another preferred embodiment of a multi-chip package in accordance with the present invention. Besides the wire bonding connections between the second chips 40, 42 and the substrate 10 as described above; alternatively, flip-chip bonding connections can be employed. In that case, the second chips 40, 42 are positioned with the second active surfaces 40a, 42a facing to the first surface 14. Electrical connections between the second bonding pads 40c, 42c and the conductive traces 18 are established by means of a plurality of solder bumps 52 of materials including tin-lead alloy or gold. An underfill 54 of materials including liquid encapsulant, epoxy, etc. can be disposed in the gap between the second chips 40, 42 and the first surface 14, which underfill encapsulates the solder bumps 52. This prevents the thermal cycling fatigue of the solder bumps 52 due to the thermal stresses that arises during normal operation.

Since the area array arrangement can provide a relatively high integration level, the ball grid array (BGA) structure is employed in the embodiments described above. However, the multi-chip packaging structure disclosed in the present invention can also be configured on other types of carriers. Based on the foregoing, advantages of the present invention include the following.

1. In the multi-chip packaging structure according to the present invention, LOC structure is used to affix some chips, which shortens the path length among chips, and hence, the path of signal transmission. Therefore, the path resistance and the signal delay are reduced. Thus, the communication speed and the overall performance are increased.

2. In the multi-chip packaging structure according to the present invention, chips are positioned on both sides of the substrate and LOC structure is used to affix some chips. Therefore, the overall package volume is reduced and the integration level of the package is increased.

3. In the multi-chip packaging structure according to the present invention, by means of the heat sink arrangement, the heat dissipation performance of the package is improved, and hence, the heating problem, which is the main problem of a multi-chip package, has been resolved.

4. The multi-chip ball grid array packaging structure according to the present invention can further reduce the packaging volume, and hence, the integration level of the package is increased. Moreover, the materials and equipment employed in the present invention can all be provided by current technique. Therefore, the cost of production is reduced and the reliability is increased.

Although preferred embodiments have been shown for purposes of illustrating the present invention, it will be apparent to those skilled in the art that various changes and modifications in the present invention disclosed herein may be made without departing from the scope of the present invention, which is defined in the appended claims.

What is claimed is:

1. A multi-chip packaging structure, comprising:

a substrate having a top surface and a bottom surface, the substrate having an opening defined substantially in a middle section of the substrate through the top surface and the bottom surface, wherein the substrate includes at least one via contact;

a first chip having a first active surface and a first non-active back surface, wherein the first chip has a plurality of first bonding pads on the first active surface, the first chip is attached to the bottom surface of the substrate such that the first chip is electrically connected to the top surface of the substrate through the opening;

at least one second chip having a second active surface and a second non-active back surface, wherein the second chip has a plurality of second bonding pads on the second active surface, the second chip is attached to the top surface of the substrate by its second non-active back surface and electrically connected to the top surface of the substrate, and wherein the second chip is externally electrically connected to an external unit through the via contact; and a heat sink directly attached on the first back non-active surface of the first chip and thermally coupled with the first chip, wherein the heat sink is not in direct contact with the bottom surface of the substrate.

2. The multi-chip packaging structure of claim 1, wherein the second back surface of the second chip faces the first surface of the substrate and is secured thereon by the second bonding pads electrically connected to the conductive areas by at least one bonding wire.

3. The multi-chip packaging structure of claim 1, wherein the second active surface of the second chip faces the first surface of the substrate as arranged with the second bonding pads electrically connected to the conductive areas by at least one solder bump.

4. The multi-chip packaging structure of claim 1, wherein the second surface of the substrate including a recess sized and shaped to receive the first chip with the first chip located inside the recess.

5. A multi-chip ball grid array package, comprising:

a laminated substrate having a top surface and a bottom surface, the laminated substrate having an opening defined substantially in a middle section of the laminated substrate through the top surface and the bottom surface, and the laminated substrate having at least one via contact and a plurality of solder ball pads located on the bottom surface thereof;

a first chip having a first active surface and a first non-active back surface, wherein the first chip is attached to the bottom surface of the substrate;

a plurality of first bonding pads formed on a central region of the first active surface of the first chip and are exposed by the opening such that the first chip is electrically connected to the top surface of the laminated substrate through the opening;

at least one second chip having a second active surface and a second non-active back surface, wherein the second chip is attached to the top surface of the laminated substrate by its second non-active back surface;

a plurality of second bonding pads formed on a peripheral region of the second active surface of the second chip, wherein the second bonding pads are electrically connected to the top surface of the substrate and wherein the second chip is externally electrically connected to an external unit through the via contact;

a heat sink directly attached on the first non-active back surface of the first chip and thermally coupled with the first chip, wherein the heat sink is not in direct contact with the bottom surface of the substrate;

an encapsulant at least enveloping connections between the first bonding pads, the second bonding pads and the via contact; and a plurality of solder balls placed on the solder ball pads, wherein the second chip is externally electrically connected to the solder balls through the via contact.

6. The multi-chip ball grid array package of claim 5, wherein the second surface of the laminated substrate includes a recess sized and shaped to receive the first chip with the first chip located inside the recess.

7. The multi-chip ball grid array package of claim 5, wherein the second back surface of the second chip faces the first surface of the laminated substrate and is secured on it with the second bonding pads electrically connected to the conductive connections by at least one bonding wire.

8. The multi-chip ball grid array package of claim 5, wherein the second active surface of the second chip faces the first surface of the laminated substrate as arranged with the second bonding pads electrically connected to the conductive connections by at least one solder bump.

9. The multi-chip ball grid array package of claim 5 further comprising an underfill disposed between the second active surface of the second chip and the first surface of the laminated substrate.

10. The multi-chip ball grid array package of claim 5, wherein a surface of the heat sink is thermally coupled with the first back surface of the first chip, and another surface of the heat sink is not enveloped by the encapsulant, and hence is exposed.

11. The multi-chip ball grid array package of claim 10, wherein the multi-chip ball grid array package is applicable for affixation on a printed circuit board, the printed circuit board comprises a plurality of conductive areas with the solder balls electrically connected to the conductive areas, and the exposed surface of the heat sink is thermally coupled with the conductive areas.

* * * * *